United States Patent [19]
Johnson et al.

[11] Patent Number: 5,472,787
[45] Date of Patent: Dec. 5, 1995

[54] ANTI-REFLECTION AND ANTI-OXIDATION COATINGS FOR DIAMOND

[75] Inventors: Linda F. Johnson; Karl A. Klemm; Mark B. Moran, all of Ridgecrest, Calif.

[73] Assignee: The United States of America as represented by the Secretary of the Navy, Washington, D.C.

[21] Appl. No.: 931,463

[22] Filed: Aug. 11, 1992

[51] Int. Cl.⁶ ..................................... B32B 9/04
[52] U.S. Cl. ..................... 428/448; 428/333; 428/698; 428/699; 428/701; 428/702; 428/908.8; 359/359; 359/360
[58] Field of Search .................. 428/408, 446, 428/448, 688, 689, 699, 701, 702, 908.8, 333, 698; 359/359, 360

[56] References Cited

U.S. PATENT DOCUMENTS

| | | | |
|---|---|---|---|
| 4,072,782 | 2/1978 | Kramer et al. | 428/409 |
| 4,840,442 | 6/1989 | Mouchart | 428/333 |
| 4,907,846 | 3/1990 | Tustison | 428/908.8 |
| 4,995,684 | 2/1991 | Tustison | 428/908.8 |
| 4,995,684 | 2/1991 | Tustison et al. | 350/1.6 |
| 5,169,676 | 12/1992 | Moran | 428/408 |
| 5,233,464 | 8/1993 | Costich | 359/359 |

OTHER PUBLICATIONS

M. B. Moran, K. A. Klemm, & L. F. Johnson: "Antireflection/Antioxidation Coatings & Polishing Results For PECVD Diamond Optics"; *Proceedings of Applied Diamond Conf. 1991, Auburn University, Auburn, Ala.*; 19 Aug. 1991.

T. H. Allen, W. T. Beauchamp, & B. P. Hichwa; "Enhanced Optical Thin–Film Materials" pp. 105–109; *Photonics Spectra*; Mar. 1991.

M. Lesser: "Antireflection Coatings For Silicon Charge–Coupled Devices"; pp. 911–915; *Optical Engineering*; Sep. 1987/vol. 26 No. 9.

P. Baumeister & O. Arnon; "Use of Hafnium Dioxide in Multilayer Dielectric Reflectors for the Near UV"; pp. 439–444; *Applied Optics*; Feb. 1977/vol. 16 No. 2.

*Primary Examiner*—Ellis P. Robinson
*Assistant Examiner*—Timothy M. Speer
*Attorney, Agent, or Firm*—John L. Forrest, Jr.; Melvin J. Sliwka; Stephen J. Church

[57] ABSTRACT

Coatings for a diamond surface of an optical element control reflections and oxidation at the surface. Transmissive element coatings effective in the infrared and at up to 800° C. have a first layer of amorphous hydrogenated silicon deposited directly on the diamond and have a second layer of aluminum nitride, yttrium oxide, hafnium oxide or other refractory oxide deposited directly on the first layer. The first layer may be relatively thin and for adhesion only with the second layer constructed of an oxide and having a thickness selected to control reflection, or the thicknesses of both layers may be selected together to control reflection with the proportion of hydrogen in the first layer varied to select its refractive index.

18 Claims, 2 Drawing Sheets

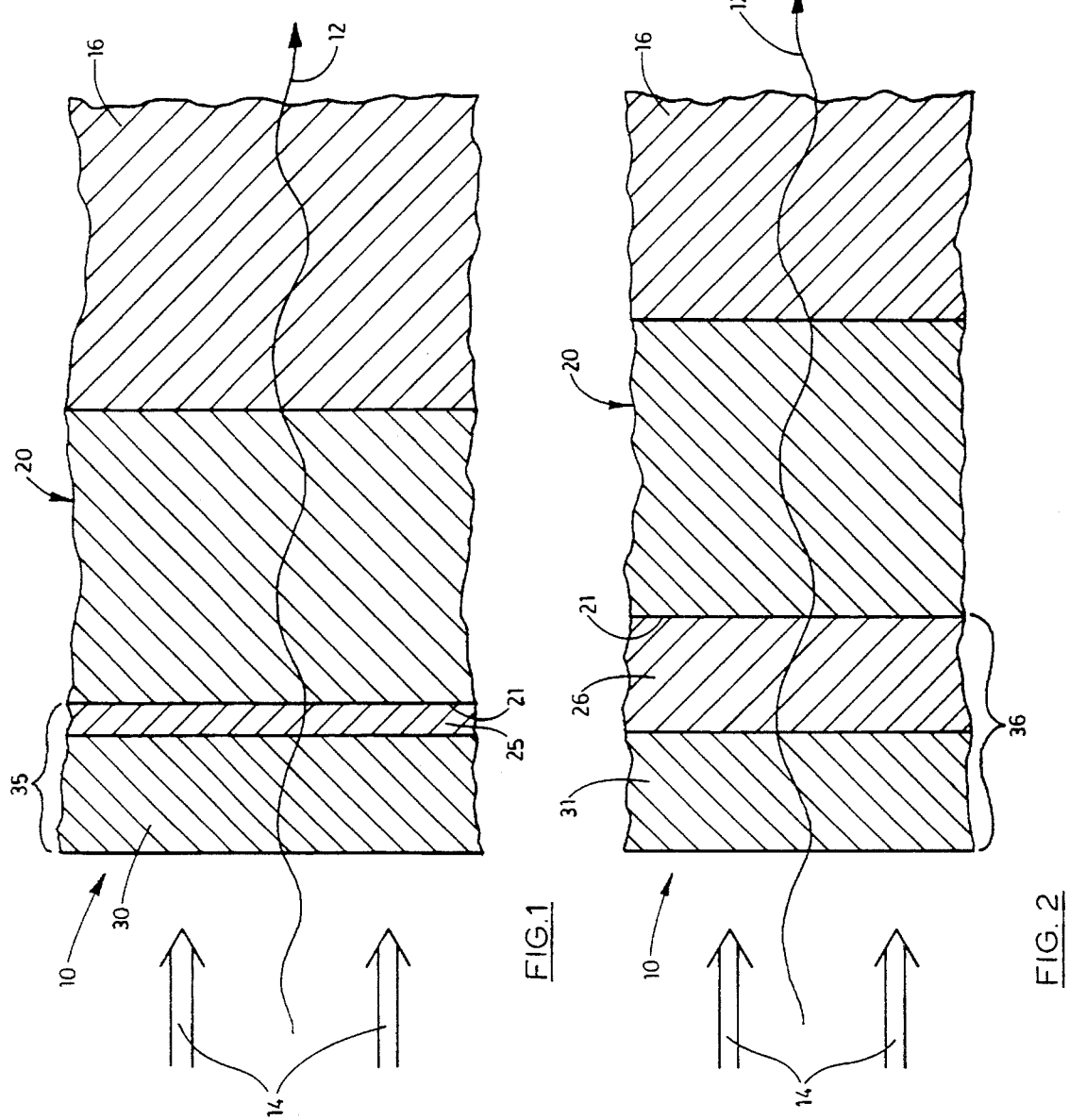

5,472,787

ANTI-REFLECTION AND ANTI-OXIDATION COATINGS FOR DIAMOND

BACKGROUND OF THE INVENTION

1. Field of the Invention

The present invention pertains to reflection control coatings for optical elements and to protective coatings for such elements. The invention is adapted to coatings for an optical element constructed of diamond, and is particularly applicable to a coating which is refractory, which is transmissive to infrared, and which reduces unwanted reflection. The coatings may have plural, diverse layers and may include amorphous hydrogenated silicon and aluminum nitride or an oxide of hafnium or yttrium or other refractory oxide.

2. Description of the Prior Art

Conventional materials, such as zinc sulfide and zinc selenide, used for infrared transmitting domes, windows and the like elements, have relatively little resistance to abrasion and fracture. This deficiency is particularly serious in such windows exposed to aerodynamic heating with accompanying particle and raindrop impact. However, diamond is highly resistive to abrasion and thermal shock, is transmissive from the ultraviolet through the infrared, and is resistive to radiation damage. Recent developments provide polycrystalline diamond of optical quality for use as a protective coating on such conventional materials or for use by itself as an optical element. However, diamond has a very high index of refraction, particularly in the infrared, so that reflective losses at an air to diamond interface limit infrared transmission to about 70%. Also, although diamond is highly resistive to environmental effects, diamond oxidizes in air at temperatures of 700° C. or more, conditions typically sustained in aerodynamic heating.

It is, therefore, highly desirable to provide diamond surfaces in optical elements with anti-reflective coatings providing high transmission in the infrared, and it is highly desirable that such coatings also resist oxidation during aerodynamic heating. To be effective, the resistance of diamond elements with such coatings to environmental damage should be comparable to that of diamond itself, and the coatings should not become detached or otherwise damaged by thermal effects including thermal cycling.

SUMMARY AND OBJECTS OF THE INVENTION

Coatings for a diamond surface of an optical element are constructed in accordance with the present invention to control reflections and oxidation at the surface. Such coatings for transmissive elements effective in the infrared and at up to 800° C. have a first layer of amorphous hydrogenated silicon, α-Si:H, deposited directly on the diamond and have a second layer which is deposited directly on the first layer and which consists of aluminum nitride, yttrium oxide, hafnium oxide, or other refractory and optically transmissive oxide such as tin oxide, zinc oxide, cerium oxide or zirconium oxide. In one coating in accordance with the invention, the first layer is relatively thin for adhesion and the second layer is such an oxide and has its thickness selected to reduce reflections. In another coating in accordance with the invention, the second layer may be aluminum nitride or one of the oxides and the thicknesses of both layers are selected together to reduce reflections. When the first layer is used for reflection control, its refractive index may be selected by varying the proportion of hydrogen in the amorphous hydrogenated silicon.

It is an object of the present invention to provide anti-reflective coatings for diamond.

It is also an object to provide anti-oxidation coatings for diamond.

A particular object is to provide polycrystalline diamond films with coatings which are anti-reflective in the infrared and are resistive to oxidation from aerodynamic heating.

Still another object is to provide such coatings for application to diamond optical elements wherein the coatings have the above advantages, are substantially more resistant to oxidation than diamond, and are effectively as resistant to other environmental damage as is diamond.

Yet another object is to provide such coatings which are not detached or otherwise damaged by aerodynamic heating or thermal cycling.

Further objects are to provide such coatings which are economical, convenient to apply, and fully effective.

BRIEF DESCRIPTION OF THE DRAWINGS

The features of the present invention will be apparent from the following detailed description when considered with the accompanying drawings wherein:

FIG. 1 is a section of an optical element having a substrate and having thereon a layer of diamond provided with a coating embodying the present invention and depicted as having a relatively thin layer and a thicker layer, the element being shown with arrows indicating the incidence of optical radiation and the impact of environmental hazards onto the element;

FIG. 2 is a section similar to FIG. 1, but having a coating embodying the present invention and depicted as having two layers of about the same thickness.

DETAILED DESCRIPTION

Figure 3:
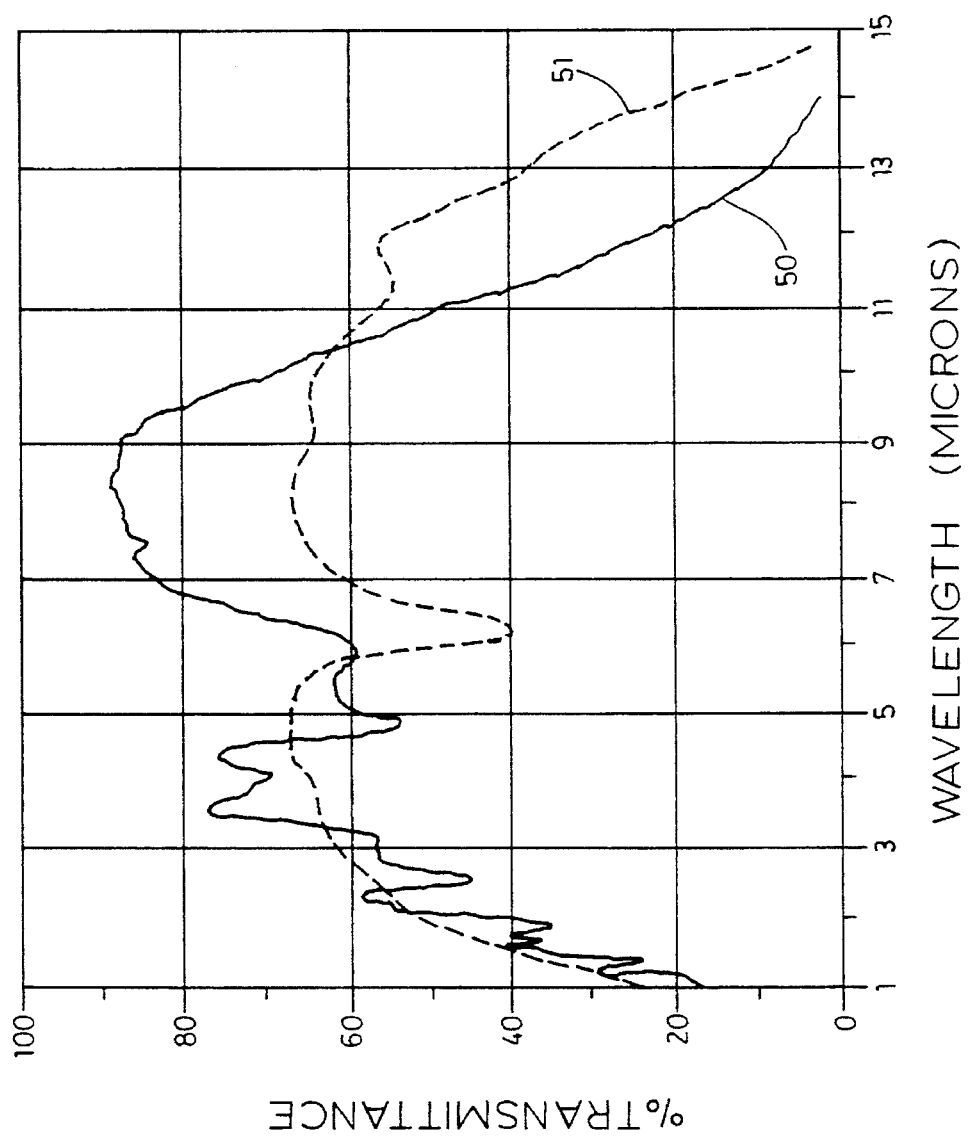
FIG. 3 is a graph showing the anti-reflection effectiveness of a coating corresponding to that of FIG. 2.

FIGS. 1 and 2 show optical elements indicated generally by the numeral 10 and having optical radiation, for example infrared radiation having a wavelength in the range of about 3 to about 12 microns and indicated by arrows 12, incident on the elements. Elements 10 are depicted as transmissive elements with radiation 12 passing through the elements; however, it will be subsequently apparent that principles of the present invention are also applicable to coatings for reflective elements. As indicated by arrows 14, elements 10 have environmental hazards impacting thereon, these hazards typically including particulate matter, rain drops, and aerodynamic heating caused by air flow in the direction of the arrows. When such an element is an optical window in a supersonic vehicle, the combination of aerodynamic heating to several hundred degrees Celsius and impact of rain drops is particularly damaging to conventional and relatively soft infrared window materials such as zinc selenide or zinc sulfide. These materials have an index of refraction of about 2.2–2.4 for infrared and have coefficients of thermal expansion of about $7.6 \times 10^{-6}/°C$. In each element 10, for economy, these conventional materials are typically used as a relatively thick, about 3 mm, substrate 16 which forms the bulk of the element.

Each element 10 has a layer 20 of diamond material disposed on substrate 16 in the direction from which hazards 14 approach to protect substrate from abrasion, thermal shock and other environmental hazards. Diamond layer 20 has a surface 21 opposite substrate 16. In the infrared, the index of refraction of diamond, such as the material of layer 20, is about 2.4 and thus about that of the material of substrate 16. However, the coefficient of thermal expansion of diamond is about $1.0 \times 10^{-6}/°C$. Diamond layer 20 typically has a thickness of about 20–40 microns; is polycrystalline; may be generated in any suitable manner, which is not a portion of the present invention, but typically involves chemical vapor deposition from a gas containing a carbon compound. Layer 20 may be applied to substrate 16 in any suitable manner which is also not a portion of the present invention, but may utilize bonding with chalcogenide glass, not shown but set forth in U.S. Pat. No. 4,072,782. Such glass accommodates the difference in thermal expansion of diamond and the substrate 16 material and has about the same index of refraction as these materials so that significant reflection does not occur between substrate 16 and layer 20.

As before mentioned, at an interface of diamond and air the diamond is subject to oxidation at temperatures of 700° C. or more, and reflective losses are high due to the relatively high index of refraction of diamond. Either or both of these problems are overcome by the present invention which involves the application directly on surface 21 of diamond layer 20 of a first layer constructed of amorphous hydrogenated silicon, $\alpha$-Si:H, which has a coefficient of thermal expansion about $2.6 \times 10^{-6}/°C$. Such a first layer may be relatively thin as depicted in FIG. 1 and there indicated by numeral 25. Layer 25 is only thick enough for adhesion purposes shortly to be described and, for use in the FIG. 1 embodiment, preferably has a thickness in a range of about 100 to about 1000 Angstrom units so that, in the infrared, layer 25 does not significantly affect reflection of radiation 12 at diamond surface 20. However, the amorphous hydrogenated silicon first layer of the present invention may also be relatively thick as depicted in FIG. 2 and there indicated by numeral 26. Layer 26 serves the adhesion purposes of layer 25, but also has any suitable thickness appropriate, together with the thickness of another and subsequently described layer, for the use of layer 26 as an anti-reflection layer for diamond surface 21. The layer 26 thickness corresponds to the about 2.8 index of refraction in the infrared of amorphous hydrogenated silicon having about 20 atomic percent hydrogen, this index being selectable as subsequently described by varying the proportion of hydrogen in the amorphous hydrogenated silicon.

The present invention includes a second layer constructed of a refractory material transparent to radiation 12, this second layer being indicated in FIG. 1 by numeral 30 and in FIG. 2 by numeral 31. It will be subsequently apparent that either layer 25 together with layer 30 or layer 26 together with layer 31 define an anti-reflection and anti-oxidation coating of element 10 for diamond layer 20, this coating being indicated in FIG. 1 by numeral 35 and in FIG. 2 by numeral 36. Second layer 30 or 31 is deposited directly on the corresponding first amorphous hydrogenated silicon layer 25 or 26 and has any suitable thickness appropriate for use of the second layer as an anti-reflection layer. The second layer may be deposited by any suitable method, as by well-known methods set forth in the examples below.

In the FIG. 1 embodiment, second layer 30 of coating 35 is a refractory oxide. Yttrium oxide, $Y_2O_3$ which has a coefficient of thermal expansion about $7.3 \times 10^{-6}/°C$., and hafnium oxide, $HfO_2$ which has a coefficient of thermal expansion about $3.8 \times 10^{-6}/°C$., are transmissive in the infrared and have been found effective for the purposes of the present invention with radiation 12 having a wavelength of about 10 microns. Other refractory oxides, such as tin oxide, $SnO_2$; zinc oxide, $ZnO_2$; cerium oxide, $CeO_2$; and zirconium oxide, $ZrO_2$, which are transmissive in the infrared and have coefficients of thermal expansion and refractive indices similar to those of yttrium and hafnium oxides, are also believed effective for the purposes of the present invention with infrared radiation in the range of 3 to 12 microns. Because of the thinness of layer 25, the thickness of the refractive oxide layer 30 is alone selected to provide diamond surface 21 with the anti-reflection feature of the present invention. Since the refractive index of each of these oxides in the infrared is about 1.6 and thus about the square root of that of diamond, a single layer of these oxides is effective in a well-known manner as an anti-reflective layer for diamond surface 21.

In the FIG. 2 embodiment, the thickness of layer 31 of coating 36 is selected, together with the thickness of layer 26 as before mentioned, to provide diamond surface 21 with the anti-reflection feature of the present invention. The thicknesses of layers 26 and 31 may be selected and optimized by any suitable calculations as, for example, the "Macleod Thin-Film Design Software" copyrighted 1983–92 by H. A. Macleod. Second layer 31 is, for resistance to thermal effects, preferably constructed of the refractory nitride, aluminum nitride, AlN, which is transmissive in the infrared, has a coefficient of thermal expansion about $2.6 \times 10^6/°C$., and has an index of refraction in the infrared of about 2.2. However, it has been found that the present invention is also effective with second layer 31 constructed of the above-described yttrium oxide, and the present invention is believed effective with second layer 31 constructed of the above-identified hafnium oxide, tin oxide, zinc oxide, cerium oxide, or zirconium oxide which, as before stated, have coefficients of thermal expansion and refractive indices similar to that of yttrium oxide.

EXAMPLES

Examples showing the details of coatings embodying the present invention, results obtained with these coatings, and comparisons with other coatings will now be presented. Layers of materials used in these examples and comparisons were deposited as follows:

aluminum nitride

DC Magnetron Varian "S-Gun" Sputtering System
Al Target, 99.999% pure
Chamber base pressure: $2 \times 10^{-7}$ torr
Total working pressure (Pure $N_2$): $2.0 \times 10^{-3}$ torr
Target Voltage: 360 V
Current: 3.5 A
Target-substrate distance: 28 cm
Deposition temperature: up to 100° C.
Deposition rate: 45 Å/min hafnium oxide Ion Tech Ion Beam Sputtering System
$HfO_2$ Target, 99.95% pure
Chamber base pressure: $2 \times 10^{-7}$ torr
Partial pressure $O_2$: $1.0 \times 10^{-5}$ torr
Total Working pressure (Argon + Oxygen): $3.0 \times 10^{-4}$ torr
Beam Voltage: 1350 V
Beam Current: 50 Ma
Target-substrate distance: 12 cm
Deposition temperature: up to 100° C.
Deposition rate: 30 Å/min yttrium oxide Ion Tech Ion Beam Sputtering System
Yttrium metal target, 99.9% pure
Chamber base pressure: $2 \times 10^{-7}$ torr -continued Partial pressure O$_2$: 1.0 × 10$^{-5}$ torr
Total working pressure (Argon + Oxygen): 3.0 × 10$^{-4}$ torr
Beam Voltage: 1000 V
Beam Current: 50 Ma
Target-substrate distance: 12 cm
Deposition temperature: up to 100° C.
Deposition rate: 35 Å/min
amorphous hydrogenated silicon DC Magnetron Varian "S-Gun" Sputtering System
Si Target, 99.9999% pure
Chamber base pressure: 2 × 10$^{-7}$ torr
Partial pressure Hydrogen: 0.0–1.0 × 10$^{-4}$ torr
Total working pressure (Argon + Hydrogen): 2.0 × 10$^{-3}$ torr
Target Voltage: 560 V
Current: 1.0 A
Target-substrate distance: 28 cm
Deposition temperature: up to 200° C.
Deposition rate: 90 Å/min In such deposition of amorphous hydrogenated silicon, the ratio of hydrogen to silicon is selected by varying the partial hydrogen pressure, the atomic percent hydrogen varying from zero to about 20 as the partial hydrogen pressure is varied in the above specified range from zero to 1.0×10$^{-4}$ torr. The partial hydrogen pressure of 1.0×10$^{-4}$ torr is believed to provide amorphous hydrogenated silicon having the above mentioned refractive index of about 2.8 in the infrared. This index was that used in calculations, as described above, to optimize together the thickness of amorphous hydrogenated silicon layer 26 and a layer corresponding to layer 31 and constructed of aluminum nitride or yttrium oxide.

Anti-reflection results obtained by the present invention with infrared radiation of 1 to 15 microns are shown in FIG. 3 for a single coating of the present invention deposited on a diamond layer forming one side of a transmissive optical element in which the diamond layer is disposed on a zinc sulfide substrate. The coating corresponds to the described coating 36 having a first layer 26 of amorphous hydrogenated silicon deposited directly on the diamond and having a second layer 31 of aluminum nitride deposited directly on the first layer. The thicknesses of both of the layers were calculated as described above for optimization with a wavelength of about 10.6 microns, the calculated thicknesses being about 12000 Angstrom units (1.20 microns) for the amorphous hydrogenated silicon and 1.45 microns for the aluminum nitride. However, the thicknesses of the layers as deposited were somewhat less so that the coating was most effective with radiation of about 7 to 9 microns as depicted by solid line 50 in FIG. 3. The transmission of uncoated zinc sulfide, which is substantially that of diamond coated zinc sulfide because of the above-noted similarity of refractive indices, is shown by dash line 51. It is apparent that the coating of the present invention increases transmission at 9 microns from about 65 percent, for the uncoated zinc sulfide, to about 90 percent. It will be apparent to one skilled in the art of anti-reflective coatings that deposition of a second coating of the present invention, on the side of the optical element opposite the first coating and having substantially the same construction as the first coating, would result in nearly 100 percent transmittance with the about 9 micron radiation.

The effectiveness of the present invention in resisting thermal effects, such as oxidation of a diamond layer on which coatings of the present invention are deposited, is shown by examples set forth in the immediately following Table I. In examples 1, 3, and 5, which did not use the invention, a layer of one of the materials yttrium oxide, hafnium oxide, or aluminum nitride was deposited directly on a diamond film and the resulting structure heated in air until the maximum temperature at which no damage occurred was reached. Heating was then continued until the coating became delaminated from the diamond. In accordance with the present invention and as shown in examples 2, 4, and 6, each of the materials was deposited directly on a layer of amorphous hydrogenated silicon which was, in turn, deposited directly on a diamond film, and the resulting structure similarly heated and observed for thermal effects. In all of these six examples the thickness of the layers was that calculated for anti-reflection effectiveness using a first layer, which was constructed of amorphous hydrogenated silicon and corresponds to layer 26, with a second layer which is constructed of one of the materials yttrium oxide, hafnium oxide, or aluminum nitride and corresponds to layer 31. The thickness of each first layer was about 12000 Angstrom units and the thickness of each second layer was about 1.45 microns.

TABLE I

| example | material | maximum temperature without damage, °C. | delamination temperature, °C. |
| --- | --- | --- | --- |
| 1 | Y$_2$O$_3$/diamond | 400 | 700 |
| 2 | Y$_2$O$_3$/α-Si:H/diamond | 700 | 800 |
| 3 | HfO$_2$/diamond | 500 | 600 |
| 4 | HfO$_2$/α-Si:H/diamond | 700 | 800 |
| 5 | AlN/diamond | 700 | 800 |
| 6 | AlN/α-Si:H/diamond | 800 | 900 |

It is apparent from Table I that, for each of the materials yttrium oxide, hafnium oxide, or aluminum nitride, the amorphous hydrogenated silicon layer of the present invention increased both the maximum temperature without damage and the delamination temperature by at least 100° C. and that, when aluminum nitride was used, delamination did not occur until a temperature of 900° C. was reached.

Examples set forth in the following Table II show the resistance to thermal effects of various thicknesses of an amorphous hydrogenated silicon layer which is constructed in accordance with the present invention and corresponds to first layer 25 or 26. Examples 7 and 8 of Table II are the same as examples 3 and 4 of Table I. Thus in example 7 a layer of hafnium oxide was deposited directly on diamond and there was no amorphous hydrogenated silicon layer of the present invention. In examples 8–11, the first, amorphous hydrogenated silicon layer of the present invention was used with a second layer constructed of hafnium oxide and corresponding to layer 30 or 31. In all the examples 7–11, the hafnium oxide layer had the above-noted thickness of about 1.45 microns, and the procedure was that described above in connection with Table I.

TABLE II

| example | material | thickness of α-Si:H, Å | maximum temp. without damage, °C. | delamination temp., °C. |
| --- | --- | --- | --- | --- |
| 7 | HfO$_2$/diamond | — | 500 | 600 |
| 8 | HfO$_2$/α-Si:H/diamond | 12000 | 700 | 800 |
| 9 | HfO$_2$/α-Si:H/diamond | 1000 | 600 | not tested |

TABLE II-continued

| example | material | thickness of α-Si:H, Å | maximum temp. without damage, °C. | delamination temp., °C. |
|---|---|---|---|---|
| 10 | HfO₂/α-Si:H/diamond | 500 | 600 | 700 |
| 11 | HfO₂/α-Si:H/diamond | 200 | 600 | 700 |

It is apparent from Table II that an amorphous hydrogenated silicon layer of the present invention corresponding to layer 25 and having a thickness of 1000 or 500 Angstrom units, as well as such a layer as thin as 200 Angstrom units, prevents damage and delamination of the hafnium oxide layer at temperatures 100° C. higher than the temperature at which these effects occur in the absence of such an amorphous hydrogenated silicon layer. It is apparent from example 8 that the 12000 Angstrom unit thick amorphous hydrogenated silicon layer thereof, which corresponds to layer 26, prevents damage and delamination at temperatures 200° C. higher than is possible without the amorphous hydrogenated silicon layer of the present invention.

Obviously, many modifications and variations of the present invention are possible in light of the above teachings. It is, therefore, to be understood that the present invention may be practiced within the scope of the following claims other than as described herein.

What is claimed is:

1. An optical element comprising
   a diamond surface having radiation incident thereon; and
   a coating for controlling reflection of said radiation at said surface, said coating and said diamond surface together being effective to resist thermal and environmental damage and the coating including
      a first layer deposited directly on said diamond surface, and
      a second layer deposited directly on said first layer,
   said first layer consisting essentially of amorphous hydrogenated silicon adherent to said surface and to said second layer and substantially transparent to said radiation and having a refractive index in a range of about 1.5 to about 4.0 for said radiation, and said second layer consisting essentially of a material selected from the group consisting of aluminum nitride and a refractory metal oxide and substantially transparent to said radiation and having a refractive index in a range of about 1.5 to about 2.0 for said radiation.

2. The optical element of claim 1 wherein said refractory oxide is chosen from the group consisting of yttrium oxide and hafnium oxide.

3. The optical element of claim 1 wherein said refractory oxide is chosen from the group consisting of yttrium oxide, hafnium oxide, tin oxide, zinc oxide, cerium oxide, and zirconium oxide.

4. The optical element of claim 1 wherein the thickness of said first layer is relatively thin in relation to the thickness of said second layer so that said first layer does not significantly affect said reflection wherein said second layer is said refractory oxide, and wherein the thickness of said second layer is selected to reduce said reflection.

5. The optical element of claim 4 wherein the thickness of said first layer is in a range of about 100 to about 1000 Angstrom units.

6. The optical element of claim 1 wherein the thickness of said first layer and the thickness of said second layer are selected to reduce said reflection.

7. The optical element of claim 6 wherein said second layer is said aluminum nitride.

8. The optical element of claim 6 wherein said second layer is said refractory oxide.

9. The optical element of claim 6 wherein the ratio of hydrogen to silicon in said first layer is selected to determine the index of refraction thereof.

10. The optical element of claim 9 wherein said first layer has about 20 atomic percent or less of hydrogen.

11. In an optical element having a diamond surface, the improvement comprising a coating for controlling reflection of radiation incident on said diamond surface, said coating including a layer consisting essentially of amorphous hydrogenated silicon deposited directly on said diamond surface and including another layer deposited directly on said layer consisting essentially of amorphous hydrogenated silicon, said another layer consisting essentially of a material selected from the group consisting of aluminum nitride and a refractory metal oxide.

12. The improvement of claim 11 wherein said layer consisting essentially of amorphous hydrogenated silicon is an adhesion layer having a thickness in a range of about 100 to about 1000 Angstrom units and wherein the thickness of said another layer is selected to control reflection of said radiation having a wavelength in a range of about 3 to about 12 microns.

13. The improvement of claim 11 wherein said another layer is deposited directly on said layer consisting essentially of amorphous hydrogenated silicon, and said another layer consists essentially of a material selected from the group consisting of aluminum nitride, yttrium oxide, hafnium oxide, tin oxide, zinc oxide, cerium oxide, and zirconium oxide, and wherein the thickness of said layer consisting essentially of said amorphous hydrogenated silicon and the thickness of said another layer are selected to control reflection of said radiation having a wavelength of about 3 to about 12 microns.

14. An optical element comprising;
   a diamond surface; and
   an anti-oxidation and anti-reflective coating for said diamond surface, the coating including
      a first layer consisting essentially of a refractory metal oxide and having a thickness selected to control reflection, and
      a second layer consisting essentially of amorphous hydrogenated silicon,
   said second layer being deposited directly on said diamond surface and said first layer being deposited directly on said second layer.

15. The optical element of claim 14 wherein said refractory oxide is chosen from the group consisting of yttrium oxide, hafnium oxide, tin oxide, zinc oxide, cerium oxide, and zirconium oxide.

16. An optical element comprising:
   a diamond surface;
   a first layer consisting essentially of amorphous hydrogenated silicon deposited directly on said diamond surface; and
   a second layer deposited directly on said first layer and constructed of refractory and optically transmissive material, said second layer consisting essentially of a material chosen from the group consisting of aluminum nitride, aluminum oxide, hafnium oxide, tin oxide, zinc oxide, cerium oxide, and zirconium oxide.

17. The optical element of claim 16 wherein the proportion of hydrogen in said amorphous hydrogenated silicon is about 20 atomic percent or less.

18. The optical element of claim 16 wherein the ratio of hydrogen to silicon in said amorphous hydrogenated silicon is selected to determine the index of refraction of said amorphous hydrogenated silicon.

* * * * *